United States Patent [19]

George et al.

[11] Patent Number: 4,734,049

[45] Date of Patent: Mar. 29, 1988

[54] MECHANICAL LATCH MECHANISM FOR COMBINATION PORTABLE TRANSCEIVER AND CHARGING UNIT

[75] Inventors: David L. George, Indianapolis; Raymond G. Benson, Jr., Plainfield, both of Ind.

[73] Assignee: Uniden Corporation of America, Indianapolis, Ind.

[21] Appl. No.: 849,766

[22] Filed: Apr. 9, 1986

[51] Int. Cl.$^4$ ............................................. H01R 13/15
[52] U.S. Cl. ................................... 439/259; 439/342; 439/527; 439/266; 439/157
[58] Field of Search ............. 339/45, 75, 91 R, 147 R, 339/147 P

[56] References Cited

U.S. PATENT DOCUMENTS

| | | | |
|---|---|---|---|
| 3,513,478 | 5/1970 | Kemper et al. | 339/125 R |
| 3,553,585 | 1/1971 | Robertson et al. | 325/15 |
| 3,569,906 | 3/1971 | Cohen | 339/75 M |
| 3,960,426 | 6/1976 | Heritage | 339/75 R |
| 3,969,728 | 7/1976 | Hodsdon et al. | 343/702 |
| 4,005,367 | 1/1977 | Dano | 325/352 |
| 4,091,318 | 5/1978 | Eichler et al. | 320/2 |
| 4,134,070 | 1/1979 | Henderson et al. | 325/15 |
| 4,286,335 | 8/1981 | Eichler et al. | 455/89 |
| 4,310,923 | 1/1982 | Kennedy | 455/79 |
| 4,468,075 | 8/1984 | Tamura et al. | 339/75 M |

FOREIGN PATENT DOCUMENTS

| | | | |
|---|---|---|---|
| 298311 | 10/1928 | United Kingdom | 339/75 R |
| 547881 | 5/1977 | U.S.S.R. | 339/75 R |

Primary Examiner—Gil Weidenfeld
Assistant Examiner—David Pirlot
Attorney, Agent, or Firm—Woodard, Emhardt, Naughton Moriarty & McNett

[57] ABSTRACT

A combination charging unit and portable, hand-held transceiver which includes a latch mechanism operable to effect an electrical connection between the charging circuit in the charging unit and the rechargeable power supply in the transceiver automatically upon insertion of the transceiver into the charging unit. The latch mechanism causes insertion of plug connectors on the charging unit into mating connectors in the transceiver in a direction which is perpendicular to the axis of insertion of the transceiver into the charging unit. The latch mechanism prevents damage to the plug connectors by exerting a predetermined constant insertion force, independent of the force employed to seat the transceiver into the charging unit, in mating the plug connectors. The latch mechanism includes a release lever which provides a mechanical advantage to the operator during the initial portion of its release movement thus compensating for the gripping effect of the plugs with their mating connectors.

15 Claims, 5 Drawing Figures

MECHANICAL LATCH MECHANISM FOR COMBINATION PORTABLE TRANSCEIVER AND CHARGING UNIT

BACKGROUND OF THE INVENTION

The present invention relates generally to the field of mobile communication devices and, more particularly, to a latch mechanism for electrically connecting and disconnecting a portable transceiver to a charging device.

In order to increase the flexibility of portable communications devices, hand-held transceivers are provided with vehicular charging and amplifying units which permit the hand-held transceiver to be mounted in a vehicle and used in a similar manner as a dedicated vehicular transceiver. Since hand-held transceivers carry their own battery to supply power, it has been found desirable to provide the vehicular unit with the capability to charge the battery while the transceiver is mounted inside it. In addition, it has been found desirable to provide a separate mobile microphone and RF amplifier wih an associated vehicular antenna to be used when the transeiver is mounted in the charging mode. The microphone incorporates a conventional "push-to-talk" switch for controlling the transceiver.

Electrical connections between the transceiver and vehicular unit are therefore required. There are many design constraints on the means for effecting this electrical connection, not the least of which is that the electrical connection should not be disturbed by movement of the vehicle over bumps, etc. Ideally, the force applied in making the connection should be independent of the force applied in inserting the portable unit into the charger-amplifier. It is necessary that connection and disconnection be accomplished in a manner that will not cause damage to the electrical connectors, even when insertion and removal of the hand-held transceiver occurs frequently over a long period of use. In addition, the connection and disconnection must be reliably accomplished with little difficulty to the operator.

U.S. Pat. No. 4,286,335 to Eichler et al. discloses a portable hand-held transceiver and charger unit having an insertion mechanism operating perpendicularly to the axis of insertion of the transceiver for effecting a circuit connection between the transceiver and the antenna of the charging unit.

U.S. Pat. No. 4,091,318 to Eichler et al. is a further example of a vehicular charger unit and portable hand-held transceiver. Interconnection of the charging circuitry and transceiver power supply is accomplished along the axis of insertion of the transceiver as the transceiver is inserted into the mobile unit.

U.S. Pat. No. 3,553,585 to Robertson et al. is generally relevant for its disclosure of a latching mechanism for a hand-held transceiver.

The following references are believed generally pertinent to the field of the subject invention in that they disclose various devices for two-way transceiver radios:

| U.S. Pat. No. | Inventor |
| --- | --- |
| 3,969,728 | Hodsdon et al. |
| 4,005,367 | Dano |
| 4,124,070 | Henderson |
| 4,310,923 | Kennedy |

SUMMARY OF THE INVENTION

A combination charging unit and portable transceiver, according to one embodiment of the subject invention includes a latch mechanism operable to effect the electrical connection between the charging circuit in the charging unit and the rechargeable power supply in the transceiver automatically upon proper seating of the transceiver inside the charging unit. The latch mechanism accomplishes the electrical connection by causing insertion of plug connectors on the charging unit into mating connectors in the transceiver in a direction which is perpendicular to the axis of insertion of the transceiver into the charging unit. The latch mechanism prevents damage to the plug connectors by exerting a predetermined constant insertion force, independent of the force employed to seat the transceiver into the charging unit, in mating the plug connectors. The latch mechanism includes a release lever which is operable to disconnect the mating connectors. The release lever provides a mechanical advantage to the operator during the initial portion of its movement to compensate for the gripping effect of the plugs with their mating connectors.

Accordingly it is an object of the present invention to provide an improved latch mechanism for effecting the electrical connection between a portable transceiver and charging unit in a manner which will reduce the likelihood of damage to the mating connectors.

It is a further object of the present invention to provide an improved latch mechanism which includes a release mechanism that provides a mechanical advantage to the operator to compensate for the gripping effect of the plugs with their mating connectors.

Related objects and advantages of the present invention will become more apparent by reference to the following figures and detailed description.

DESCRIPTION OF THE PREFERRED EMBODIMENT

Figure 5:
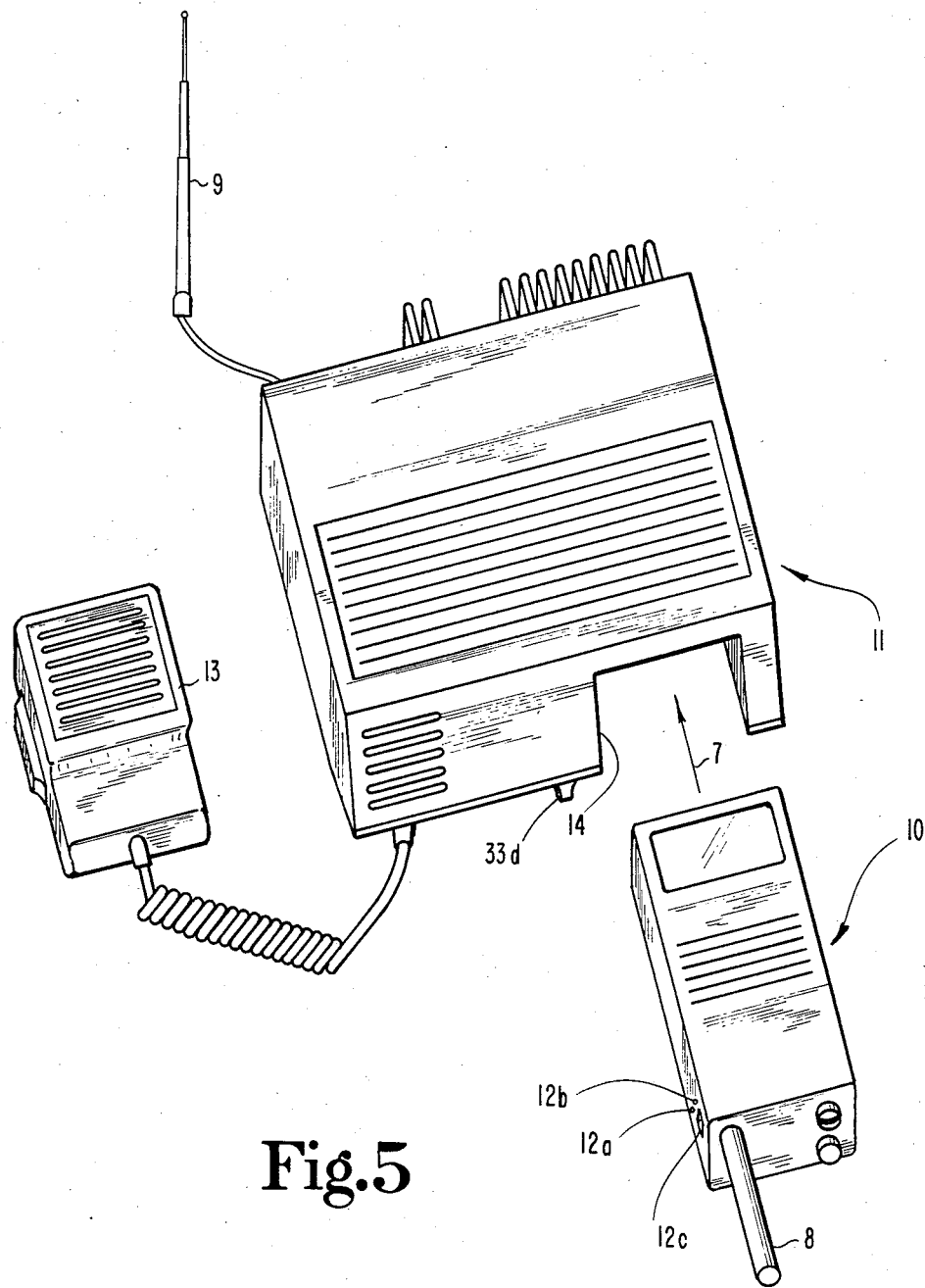
FIG. 5 is a perspective view of the portable transceiver and charging charging unit of the present invention.

Referring to FIG. 5, an exterior perspective view is shown of a hand-held portable transceiver 10 and charging unit 11 incorporating the present invention. The transceiver 10 has a rechargeable battery power supply which may be recharged through battery a charging circuit contained within charging unit 11. The charging circuit used in my preferred embodiment is disclosed in my U.S. patent application, Ser. No. 849,767, titled Transceiver Battery Charging Apparatus and Method, filed Apr. 9, 1986. Other portions of the vehicular charger are of conventional design.

Female connector 12c on transceiver 10 has multiple connections for coupling to the terminals of the battery in the transceiver, push-to-talk control circuitry and audio output signals. Female connector 12b is used for the RF connection, and female connector 12a is used for the microphone audio. In the embodiment shown, the charging unit 11 is provided with a conventional push-to-talk, hand-held microphone 13 for two-way communications capability when the portable transceiver is mounted inside the charging unit. When the transceiver is mounted inside the charging unit, its antenna 8 is disabled and vehicular antenna 9 is enabled. A receptacle 14 is provided in the housing 15 of the charging unit 11 in order to receive transceiver 10 by insertion therein in the direction shown by the arrow 7 in FIG. 5.

Figure 1:
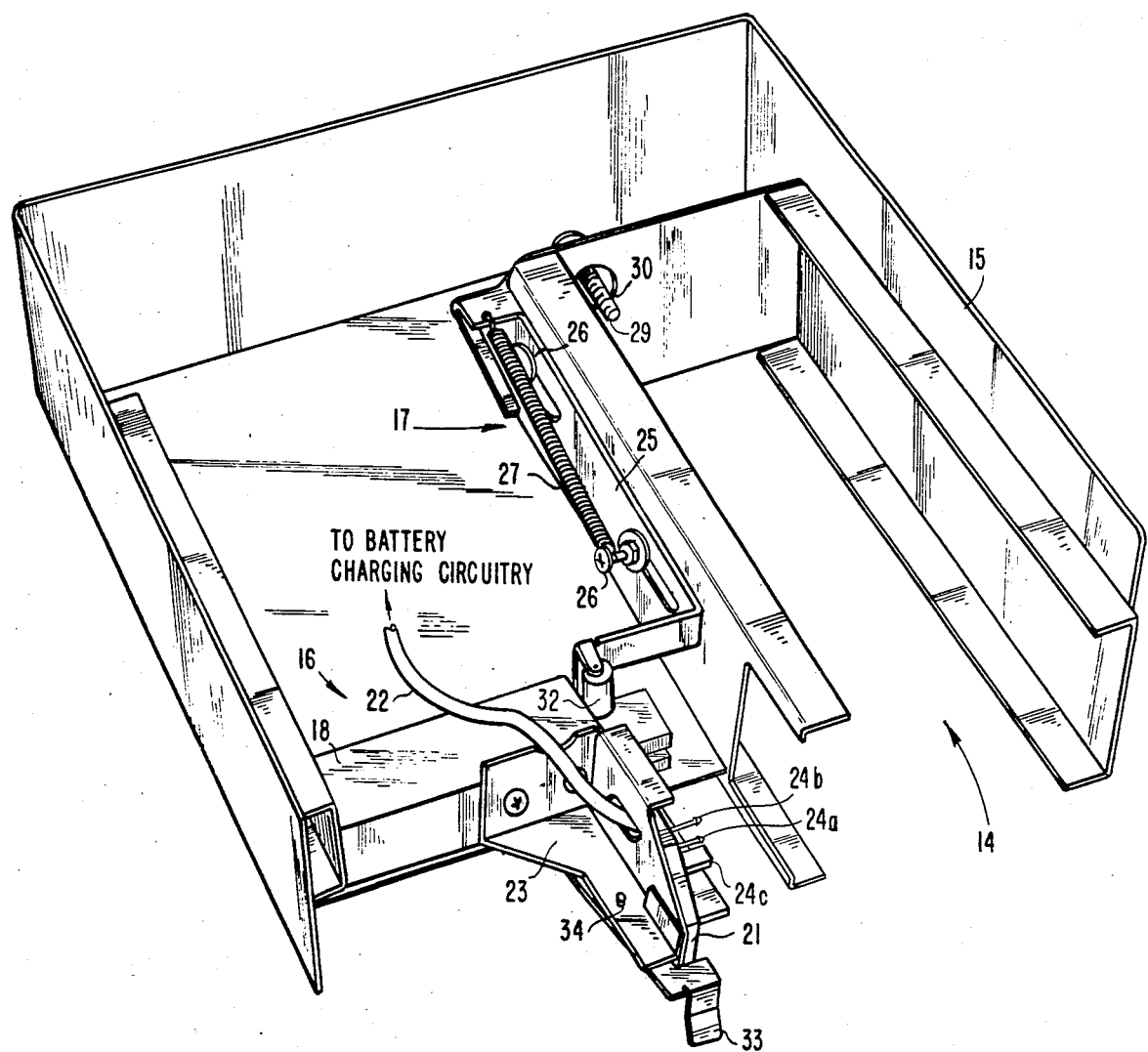
FIG. 1 is a perspective view of interior portions of the charging unit showing the latch mechanism in a first operational position.
Figure 2:
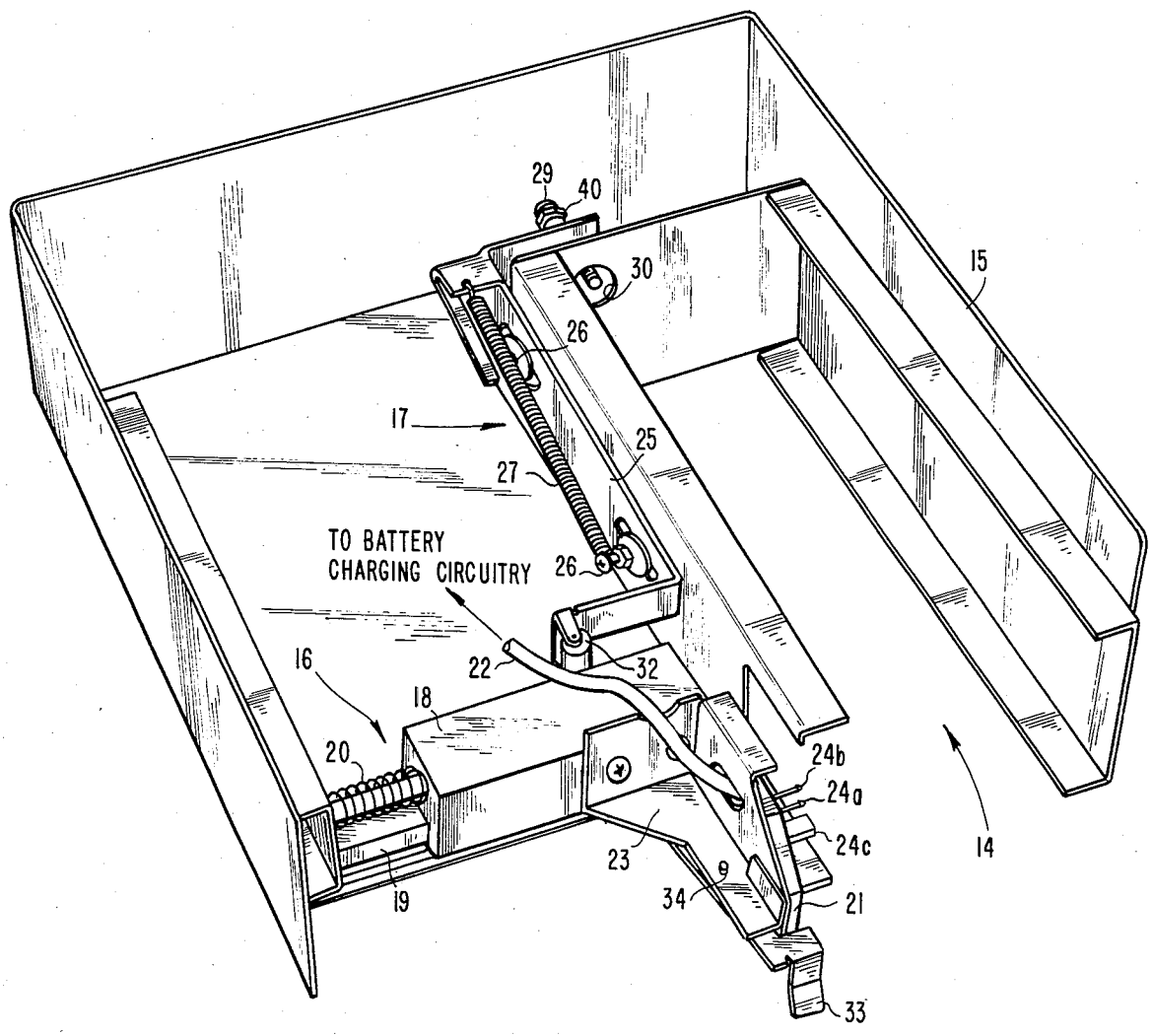
FIG. 2 is a perspective view similar to FIG. 1, but showing the latch mechanism in a second operational position.

FIGS. 1 and 2 show the construction of the latch mechanism used to effect an electrical connection between the transceiver and charging unit. The latch mechanism includes two interrelated spring-biased slide assemblies 16 and 17 mounted to housing 15 which slide along mutually perpendicular axes. Slide assembly 16 includes block 18 slidably disposed on support member 19 and biased towards receptacle 14 by coilspring 20. Male plug connector assembly 21 connects to battery charging circuitry in the charging unit via cable 22 and is mounted on a mounting bracket 23 fixedly secured to block 18. The plug connector assembly 21 has a pair of plugs 24a and 24b and a multiconnector plug 24c which are gripped by corresponding female connectors 12a, 12b, and 12c, respectively, to provide a positive mechanical connection when the connectors are mated.

Slide assembly 17 includes a bracket 25 slidably mounted to housing 15 by fasteners 26. Coilspring 27 biases bracket 25 towards the forward position. An abutment screw 29 is adjustably mounted to the rear of bracket 25 and aligned with an opening 30 in housing 15 communicating with receptacle 14. At the forward end of bracket 25 is mounted a roller bearing 32 that engages block 18.

Figure 3:
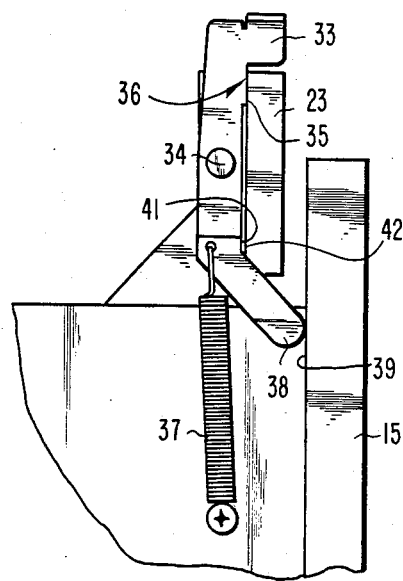
FIG. 3 is a fragmentary bottom plan view, corresponding to FIG. 2, of the release lever and associated elements.
Figure 4:
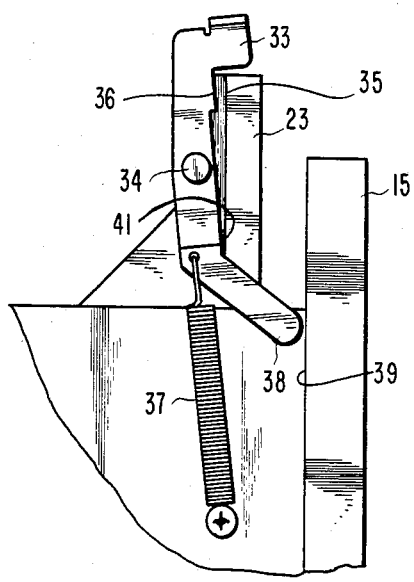
FIG. 4 is a fragmentary bottom plan view of the release lever and associated elements upon initial rightward movement of the release lever from the position shown in FIG. 3.

The latch mechanism also includes a release lever 33, the operation of which is more clearly understood by reference to FIGS. 3 and 4. Release lever 33 extends outside of the charging unit case, and has a plastic handle (33a in FIG. 5) placed upon it for grasping. Release lever 33 is pivotally mounted to the underside of bracket 23 by a pivot pin 34. Its front edge 36 is normally urged against surface 35 of bracket 23 by the force of coil spring 20 (FIG. 2) acting through arm 38 which integrally extends from lever 33 to normally bear against surface 39 of housing 15 (with slide assembly 17 being in the transceiver-engaging position of FIG. 2). A coil spring 37 serves to provide stability to arm 38.

The operation of the latch mechanism may be described as follows. Prior to insertion of the hand-held transceiver 10 into the charging unit 11, the latch mechanism is in the operational position shown in FIG. 1. When the hand-held transceiver 10 is inserted into the receptacle 14, it eventually presses against a threaded abutment screw 29 located at the rear of the receptacle 14. The distance the transceiver must travel inside receptacle 14 before engaging abutment screw 29 may be adjusted in order to ensure proper alignment of the mating plug connectors 12 and 21 by turning abutment screw 29 and fixing the position with lock nut 40 (FIG.2). The force of transceiver 10 against the abutment screw 29 causes the rearward movement of the spring-biased slide assembly 17 and roller bearing 32. As soon as the roller bearing clears the face of block 18, the block is free to slide under urging from coilspring 20 towards the transceiver to the released position shown in FIG. 2. The male plug connector 21 mounted on bracket 23 attached to block 18 is thereby forced laterally into the female plug connector 12 located in the body of transceiver 10, thereby making the electrical connection. It should be noted that the force exerted to mate plug connectors 12 and 21 is predetermined by the spring constant selected for coilspring 20 and is independent of the amount of force used to manually seat the transceiver 10 inside the charging unit 11.

Removal of the transceiver from the charging unit is accomplished by actuating the release lever 33 to the right from the position seen in FIG. 5. Initially, the release lever pivots about pin 34 and the arm 38 at the opposite end of the lever 33 urges against the surface 39 of housing 15, providing a slight mechanical advantage to the operator as the plug connector 21 is retracted from transceiver 10. As soon as the detents 24 on the prongs of plug connector 21 clear the detent grippers in the female plug connector 12, the rear edge 41 of release lever 33 urges against the surface 42 of bracket 23 as shown in FIG. 4 and further pivotal movement of lever 33 is prevented. Thereafter, movement of release lever 33 is restricted to lateral movement resulting from the sliding of block 18 on support member 19. As plug connector 21 clears transceiver 10 by a desired distance as the result of continued rightward movement of release lever 33, block 18 clears roller bearing 32 causing it to move forward under urging from coilspring 27 and lock the slide assembly 17 in its latched position. At the same time as this occurs, abutment screw 29 is urged forwardly into receptacle 14, forcing transceiver 10 out of its seated position in charging unit 11 so that it may be easily manually removed therefrom.

While there has been described above the principles of this invention in connection with specific apparatus, it is to be understood that this description is made only by way of example and not as a limitation to the scope of the invention.

What is claimed is:

1. A latch mechanism for a combination portable transceiver and charging unit, comprising:
 a housing mounted inside the charging unit, said housing defining a receptacle arranged for receiving the portable transceiver;
 a first mating connector adapted to interconnect in a mating fashion with a second mating connector on said portable transceiver; and
 a latch means mounted to said housing and operably connected to said first mating connector, said latch means for effecting an electrical connection between the portable transceiver and charging unit by mating of said first and second mating connectors upon insertion of the portable transceiver into said receiving receptable in the charging unit, said mating being accomplished perpendicularly to the axis of insertion of the portable transceiver into the charging unit, said latch means including a release lever pivotally and slidably connected to said housing, said release lever including a handle portion and an arm extending on opposite sides of the lever pivot point, said arm having a contact surface for contacting said housing after an initial pivotal movement of said handle portion of said release lever, said contact surface positioned relative to the pivot point of said release lever so as to provide a greater mechanical advantage during initial movement of said lever than at subsequent times, said latch means further having a stop means for limiting the pivotal movement of said release lever to a predetermined amount, said release lever thereby allowing the electrical separation of said first and second mating connectors to be accomplished by successive pivotal and lateral movement of said release lever.

2. The latch mechanism of claim 1 wherein said latch means includes a means for mating said first and second mating connectors by application of a fixed predetermined coupling force to said first and second connectors which is independent of the insertion force employed to seat the portable transceiver inside the charging unit.

3. The latch mechanism of claim 2 wherein said means for mating said first and second mating connectors includes:
 (a) a first slide means slidably mounted to said housing for movement between forward and rearward positions parallel to the axis of insertion of the portable transceiver;
 (b) first bias means for biasing the position of said first slide means towards the forward position;
 (c) a second slide means slidably mounted to said housing for movement between first and second positions perpendicular to the axis of insertion of the portable transceiver;
 (d) second bias means for biasing the position of said second slide means towards the second position, said first and second slide means abuttingly engaging each other in their respective positions, said forward position of said first slide means corresponding to the first position of said second slide means and said rearward position of said first slide means corresponding to said second position of said second slide means; and
 (e) abutment means mounted to said first slide means and positioned relative to said receptacle such that when said first slide means is in the rearward position, said abutment means is positioned inside the receptacle to engage with the portable transceiver within said receptacle when seated, said abutment means moving to a non-interfering position under the urging of said portable transceiver as said portable transceiver is urged into the proper seated position within the charging unit.

4. The latch mechanism of claim 3 wherein said first slide means and said abutment means include means for axially adjusting the position of said abutment means on said first slide means in order to adjust the seating relationship of the portable transceiver relative to the charging unit.

5. The latch mechanism of claim 4 wherein the position of said abutment means on said first slide means is adjustable by screw movement.

6. The latch mechanism of claim 4 wherein said first slide means includes anti-friction bearing means fixedly mounted at one end of said first slide means, said anti-friction bearing means abuttingly engaged with said second slide means in the first and second positions of said second slide means.

7. The latch mechanism of claim 6 wherein said anti-friction bearing means is a roller bearing.

8. The latch mechanism of claim 7 wherein said latch means further includes a mounting bracket fixedly fastened to said second slide means, said first connector and said release lever mounted to said mounting bracket.

9. The latch mechanism of claim 8 wherein said receptacle has a generally rectangular shaped cross section and said axis of insertion of the portable transceiver extends in a forward-rearward direction relative to said housing.

10. The latch mechanism of claim 9 wherein said mounting bracket serves as said stop means for said release lever.

11. The latch mechanism of claim 10 wherein said first mating connector is a female connector and said second mating connector is a male connector.

12. A latch mechanism for the charging unit of a combination portable transceiver and charging unit, comprising:
 a housing mounted inside the charging unit, said housing defining a receptacle arranged for receiving the portable transceiver along an axis of insertion;
 a first mating connector adapted to interconnect in a mating fashion with a second mating connector on said portable transceiver, said first mating connector lying longitudinally perpendicular to the axis of insertion of the portable transceiver; and
 a latch means operably connected to said first mating connector for effecting an electrical connection between the portable transceiver and the charging unit by mating of the first connector with said second connector perpendicularly to the axis of insertion of the portable transceiver upon proper seating of the portable transceiver into said receptacle, said latch means further for effecting electrical disconnection between the portable transceiver and the charging unit by decoupling of said first and second mating connectors, said latch means including a mechanical advantage means for providing a greater mechanical advantage during a predetermined amount of the initial movement of said first and second mating connectors during disconnection thereof as compared to subsequent movement.

13. The latch mechanism of claim 12 wherein said mechanical advantage means includes a release lever pivotally and slidably connected to said housing, said release lever accomplishing disconnection of said first and second mating connectors by successive pivotal and lateral movement of said release lever.

14. A latch mechanism for the charging unit of a combination portable transceiver and charging unit having an axis of insertion, comprising:
 a housing;
 a first mating connector adapted to interconnect in a mating fashion with a second mating connector on said, portable transceiver said first mating connector lying longitudinally perpendicular to the axis of insertion of the portable transceiver; and
 a latch means operably connected to said first mating connector for effecting an electrical connection between the portable transceiver and the charging unit by mating of the second mating connector with said first mating connector perpendicularly to the axis of insertion of the portable transceiver into the charging unit upon seating of the portable transceiver into a receiving receptacle in the charging unit, said latch means accomplishing mating by application of a predetermined fixed coupling force to said first and second mating connectors, said predetermined fixed coupling force being independent of the insertion force used to seat the portable transceiver into the charging unit.

15. The combination of claim 14 in which said first mating connector includes means to connect the portable transceiver to a microphone associated with the charging unit and to an antenna associated with the charging unit.

* * * * *

UNITED STATES PATENT AND TRADEMARK OFFICE
CERTIFICATE OF CORRECTION

PATENT NO. : 4,734,049
DATED : March 29, 1988
INVENTOR(S) : David L. George and Raymond G. Benson, Jr.

It is certified that error appears in the above-identified patent and that said Letters Patent are hereby corrected as shown below:

In column 1 at line 25 the word "transeiver" should read -- transceiver --.

In column 2 at line 60 the words "charging charging" should read -- charging --.

Signed and Sealed this

Ninth Day of August, 1988

Attest:

DONALD J. QUIGG

Attesting Officer

Commissioner of Patents and Trademarks